US009148600B2

(12) United States Patent
Park et al.

(10) Patent No.: US 9,148,600 B2
(45) Date of Patent: Sep. 29, 2015

(54) PROGRAMMABLE GAIN AMPLIFIER AND DEVICES INCLUDING THE SAME

(71) Applicant: Samsung Electronics Co., Ltd., Suwon-Si, Gyeonggi-Do (KR)

(72) Inventors: Yu Jin Park, Seoul (KR); Jae Hong Kim, Suwon-si (KR); Jin Ho Seo, Seoul (KR); Kwi Sung Yoo, Seoul (KR); Seog Heon Ham, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/295,711

(22) Filed: Jun. 4, 2014

(65) Prior Publication Data

US 2014/0368706 A1    Dec. 18, 2014

(30) Foreign Application Priority Data

Jun. 18, 2013  (KR) .......................... 10-2013-0069710

(51) Int. Cl.
*H04N 5/335*      (2011.01)
*H04N 5/3745*   (2011.01)
*H03G 3/00*      (2006.01)
*H03G 1/00*      (2006.01)
*H04N 5/378*     (2011.01)

(52) U.S. Cl.
CPC ......... *H04N 5/37457* (2013.01); *H03G 1/0088* (2013.01); *H03G 3/001* (2013.01); *H04N 5/378* (2013.01)

(58) Field of Classification Search
CPC ...... H04N 5/378; H03G 1/0088; H03G 3/001
USPC ......................................................... 348/301
See application file for complete search history.

(56) References Cited

U.S. PATENT DOCUMENTS

| 6,476,864 B1 | 11/2002 | Borg et al. |
| 6,747,264 B2 | 6/2004 | Miida |
| 7,812,876 B2 | 10/2010 | Hiyama et al. |
| 2010/0321532 A1 | 12/2010 | Hashimoto et al. |
| 2012/0119787 A1 | 5/2012 | Sakuragi |

FOREIGN PATENT DOCUMENTS

| JP | 2011-091724 A | 5/2011 |
| JP | 2011-254263 A | 12/2011 |
| JP | 2012-080252 A | 4/2012 |
| KR | 2006-0020233 A | 3/2006 |
| KR | 2006-0099325 A | 9/2006 |
| KR | 10-0881266 B1 | 2/2009 |

*Primary Examiner* — Usman Khan

(74) *Attorney, Agent, or Firm* — Harness, Dickey & Pierce, P.L.C.

(57) ABSTRACT

A programmable gain amplifier includes a sampling circuit, a source follower, a first capacitor and an error amplifier. The sampling circuit is configured to perform correlated double sampling on an input signal using a reference voltage. The first capacitor is connected between the sampling circuit and the source follower. The error amplifier is connected between an input terminal of the source follower and an output terminal of the source follower. The error amplifier is configured to reset a voltage of the output terminal of the source follower to the reference voltage during a source follower reset operation.

19 Claims, 8 Drawing Sheets

PROGRAMMABLE GAIN AMPLIFIER AND DEVICES INCLUDING THE SAME

CROSS-REFERENCE TO RELATED APPLICATIONS

This application claims priority under 35 U.S.C. §119(a) from Korean Patent Application No. 10-2013-0069710 filed on Jun. 18, 2013, the disclosure of which is hereby incorporated by reference in its entirety.

BACKGROUND

At least one example embodiment of the inventive concepts relates to a complementary metal oxide semiconductor (CMOS) image sensor (CIS), and more particularly, to an image sensor including a programmable gain amplifier and/or devices including the same.

A conventional programmable gain amplifier is a circuit that includes a plurality of capacitors having different capacitances and amplifies an input signal using the capacitance ratio between the capacitors. The amplified input signal is output to an analog-to-digital converter (ADC). When the ADC is used in a system requiring the settling of an input stage, the power consumption of the system may increase due to the limited operating speed of the programmable gain amplifier.

SUMMARY

At least one example embodiment of the inventive concepts provides a programmable gain amplifier having a new structure enabling rapid settling. At least one example embodiment of the inventive concepts also provides a programmable gain amplifier for removing kick-back noise and stabilizing the settling voltage of an output signal in a short time and devices including the same.

According to at least one example embodiment, a programmable gain amplifier (PGA) includes a sampling circuit configured to perform correlated double sampling on an input signal using a reference voltage. The PGA includes a source follower, and a first capacitor connected between the sampling circuit and the source follower. The PGA includes an error amplifier connected between an input terminal of the source follower and an output terminal of the source follower. The error amplifier is configured to reset a voltage of the output terminal of the source follower to the reference voltage during a source follower reset operation that resets the source follower.

According to at least one example embodiment, the source follower is implemented as a metal oxide semiconductor (MOS) transistor, and the error amplifier is configured to reset a voltage of the input terminal of the source follower to an input voltage higher than the reference voltage by a threshold voltage of the MOS transistor during the source follower reset operation.

According to at least one example embodiment, the error amplifier is configured to cancel an offset of the error amplifier using a second capacitor during an error amplifier reset operation that resets the error amplifier, the error amplifier reset operation occurring prior to the source follower reset operation.

According to at least one example embodiment, the error amplifier includes a plurality of switches, a second capacitor, and an amplifier. The amplifier is configured to amplify a difference between the reference voltage and an output voltage of the second capacitor. The switches are arranged to store an offset of the amplifier in the second capacitor during an error amplifier reset operation that resets the error amplifier. The switches are arranged to reset the voltage of the output terminal of the source follower to the reference voltage and reset the voltage of the input terminal of the source follower to the input voltage during the source follower reset operation.

According to at least one example embodiment, an image sensor includes a pixel; and a programmable gain amplifier (PGA). The PGA is configured to amplify a pixel signal output from the pixel. The PGA includes a sampling circuit configured to perform correlated double sampling on an input signal using a reference voltage. The PGA includes a source follower, and a first capacitor connected between the sampling circuit and the source follower. The PGA includes an error amplifier connected between an input terminal of the source follower and an output terminal of the source follower, the error amplifier being configured to reset a voltage of the output terminal of the source follower to the reference voltage during a source follower reset operation that resets the source follower.

According to at least one example embodiment, the source follower is implemented as a metal oxide semiconductor (MOS) transistor, and the error amplifier is configured to reset a voltage of the input terminal of the source follower to an input voltage higher than the reference voltage by a threshold voltage of the MOS transistor during the source follower reset operation in a reset signal sampling period.

According to at least one example embodiment, the error amplifier is configured to cancel an offset of the error amplifier using a second capacitor during an error amplifier reset operation that resets the error amplifier, the error amplifier reset operation occurring prior to the source follower reset operation, and the error amplifier reset operation and the source follower reset operation occurring during a reset signal sampling period.

According to at least one example embodiment, the error amplifier includes a plurality of switches, a second capacitor, and an amplifier. The amplifier is configured to amplify a difference between the reference voltage and an output voltage of the second capacitor. The switches are arranged to store an offset of the amplifier in the second capacitor during an error amplifier reset operation that resets the error amplifier. The switches are arranged to reset the voltage of the output terminal of the source follower to the reference voltage and reset the voltage of the input terminal of the source follower to the input voltage during the source follower reset operation. The error amplifier reset operation and the source follower reset operation are performed during a reset signal sampling period.

According to at least one example embodiment, an image processing device includes the above described image sensor, and an image signal processor configured to process image data processed by the image sensor.

According to at least one example embodiment, a portable electronic device includes the above described image sensor and image processing device. The portable electronic device includes an application processor configured to process image data processed by the image sensor.

According to at least one example embodiment, the error amplifier is configured to cancel an offset of the error amplifier using a second capacitor during an error amplifier reset operation that resets the error amplifier, the error amplifier reset operation occurring prior to the source follower reset operation, and the error amplifier reset operation and the source follower reset operation occurring during a reset signal sampling period.

According to at least one example embodiment, an image sensor includes at least one pixel, a voltage generator configured to generate a reference voltage, and a programmable gain amplifier (PGA) connected to the at least one pixel and the voltage generator. The PGA includes a sampling circuit configured to perform correlated double sampling on an input signal using the reference voltage, the input signal being based on light incident to the at least one pixel. The PGA includes a voltage transfer circuit configured to output a voltage from the sampling circuit. The image sensor includes a controller configured to control the programmable gain amplifier to operate in at least a reset phase and a signal phase, the reset phase being a phase in which an output terminal of the voltage transfer circuit is reset to the reference voltage, the signal phase being a phase in which the sampling circuit amplifies the input signal according to a capacitance ratio of capacitors within the sampling circuit and the voltage transfer circuit outputs the amplified signal.

According to at least one example embodiment, the programmable gain amplifier includes a reset circuit configured to reset the output terminal of the voltage transfer circuit to the reference voltage during the reset phase.

According to at least one example embodiment, the reset circuit includes a switching circuit configured to connect a capacitor between the output terminal of the voltage transfer circuit and an input terminal of an amplifier of the reset circuit.

According to at least one example embodiment, the reset circuit is configured to cancel an offset of an amplifier of the reset circuit using the capacitor during the reset phase.

According to at least one example embodiment, the controller is configured to operate the programmable gain amplifier in the signal phase subsequent to the reset phase.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF EXAMPLE EMBODIMENTS

Figure 1:
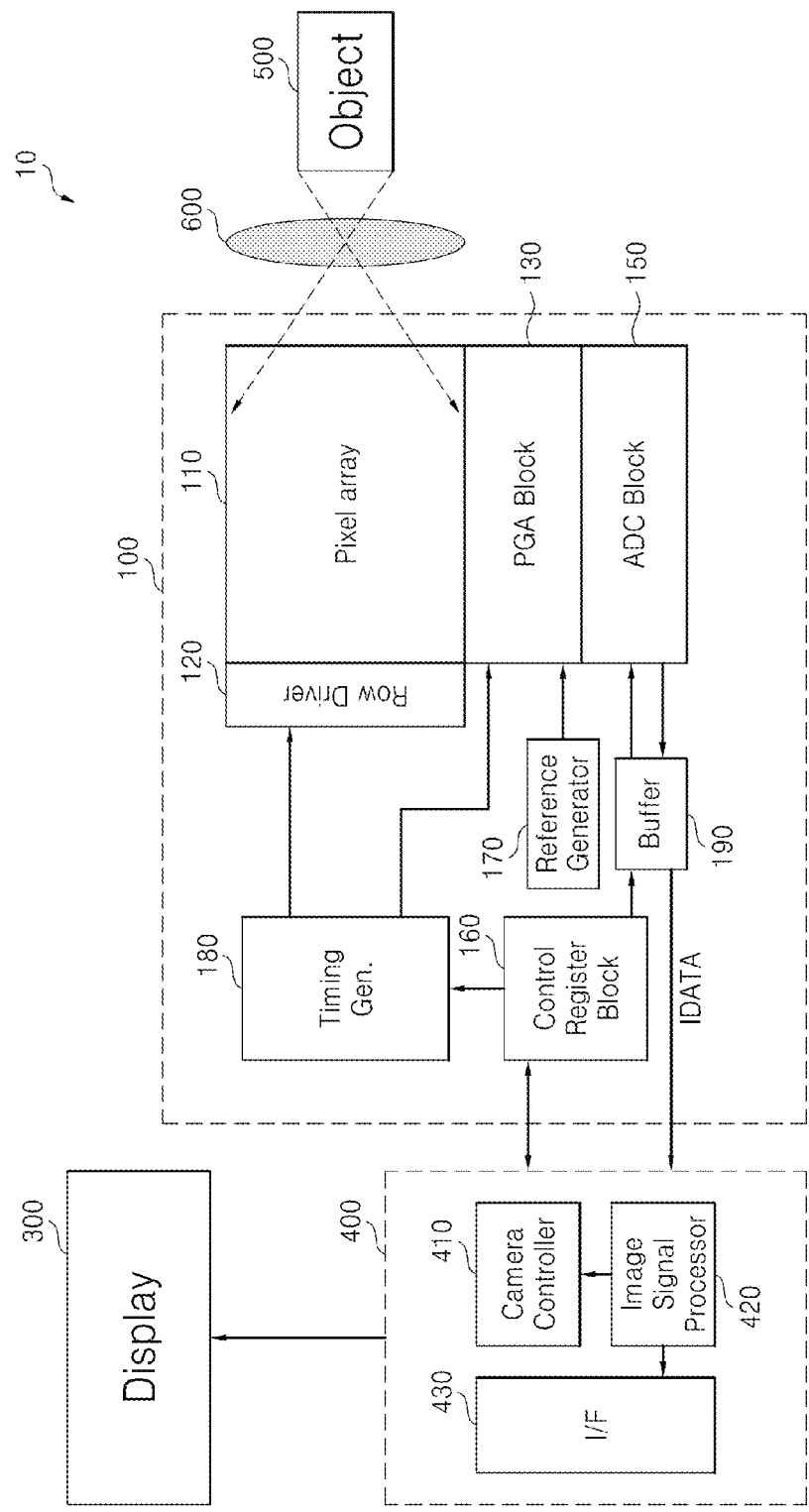
FIG. 1 is a schematic block diagram of an image processing device according to at least one example embodiment of the inventive concepts.

The inventive concepts now will be described more fully hereinafter with reference to the accompanying drawings, in which example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of an image processing device 10 according to at least one example embodiment of the inventive concepts. The image processing device 10 may be implemented as a portable electronic device such as a digital camera, camcorder, a cellular phone, a smart phone, a tablet personal computer (PC), a personal digital assistant (PDA), wearable computer, a mobile internet device (MID), etc.

The image processing device 10 includes a complementary metal oxide semiconductor (CMOS) image sensor 100, a display 300, a digital signal processor (DSP) 400, and an optical lens 600. Alternatively, the image processing device 10 may not include the optical lens 600.

The CMOS image sensor 100 generates image data IDATA corresponding to an image of an object 500 captured through the optical lens 600. The CMOS image sensor 100 includes a pixel array 110, a row driver 120, a programmable gain amplifier (PGA) block 130, an analog-to-digital converter (ADC) block 150, a timing generator 180, a control register block 160, a reference generator 170, and a buffer 190.

The CMOS image sensor 100 is controlled by the DSP 400 to sense the image of the object 500 photographed or captured through the optical lens 600 and to generate the image data IDATA corresponding to the sensing result. The DSP 400 may output image signals corresponding to the image data IDATA output from the CMOS image sensor 100 to the display 300. The DSP 400 includes a camera controller 410, an image signal processor (ISP) 420, and an interface (I/F) 430.

The camera controller 410 controls the operation of the control register block 160. The camera controller 410 may control the operation of the CMOS image sensor 100, and more specifically, the control register block 160 using a protocol such as an inter-integrated circuit (I2C) protocol, but the scope of the inventive concepts is not restricted thereto.

The control register block 160 may control the operations of the timing generator 180 and the buffer 190. The ISP 420 receives the image data IDATA from the buffer 190, processes the image data IDATA, and outputs the processed image data to the display 300 through the I/F 430.

Although the ISP 420 is positioned within the DSP 400 in FIG. 1, the ISP 420 may be positioned within the CMOS image sensor 100 in other embodiments. The CMOS image sensor 100 and the ISP 420 may be implemented together in a single package such as a multi-chip package (MCP).

Figure 2:
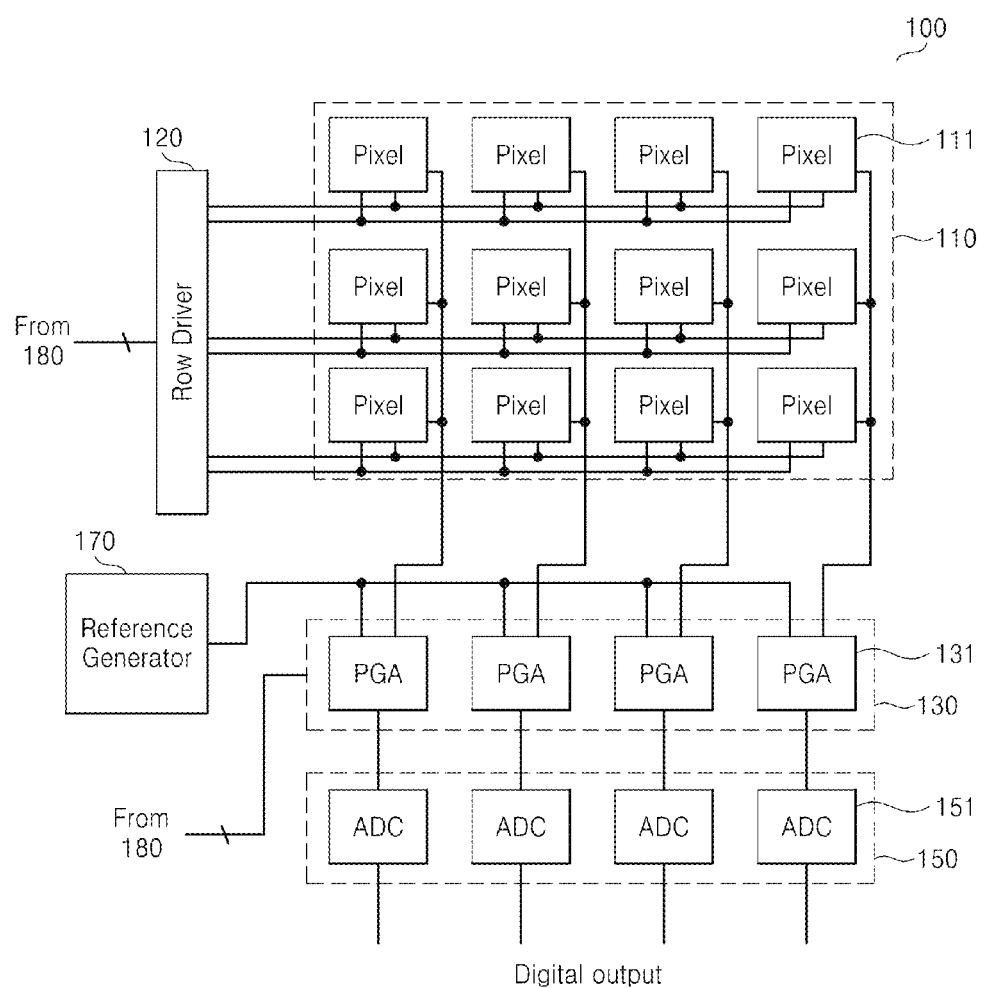
FIG. 2 is an example detailed block diagram of a complementary metal oxide semiconductor (CMOS) image sensor illustrated in FIG. 1.

FIG. 2 is an example detailed block diagram of the CMOS image sensor 100 illustrated in FIG. 1. Referring to FIGS. 1 and 2, the pixel array 110 includes a plurality of pixels 111 arranged in a matrix form. Each of the pixels 111 includes a photo sensitive device (or a photoelectric conversion device) and a readout circuit that outputs a pixel signal (Vpix in FIG. 3) corresponding to photocharges generated in the photo sensitive device. The photo sensitive device may be implemented as photo diode, a photo gate, a pinned photo diode, etc.

The row driver 120 may control the operation of the pixels 111. The row driver 120 may drive the pixel array 110 in units of rows. For instance, the row driver 120 may generate a selection signal for selecting a plurality of pixels 111 in one of a plurality of rows. A pixel signal output from each of the pixels 111 selected by the selection signal is transmitted to the PGA block 130.

The timing generator 180 may generate a control signal for controlling the row driver 120 and the PGA block 130. The reference generator 170 outputs a reference voltage to the PGA block 130. The PGA block 130 includes a plurality of PGAs 131. Each of the PGAs 131 performs correlated double sampling (CDS) on a pixel signal output from one of the pixels 111 using the reference voltage output from the reference generator 170 and amplifies the pixel signal according to the capacitance ratio between a plurality of capacitors.

The ADC block 150 includes a plurality of ADCs 151. Each of the ADCs 151 may include a sigma-delta modulator and a digital filter. Each ADC 151 may also include a plurality of switched capacitors.

Figure 3:
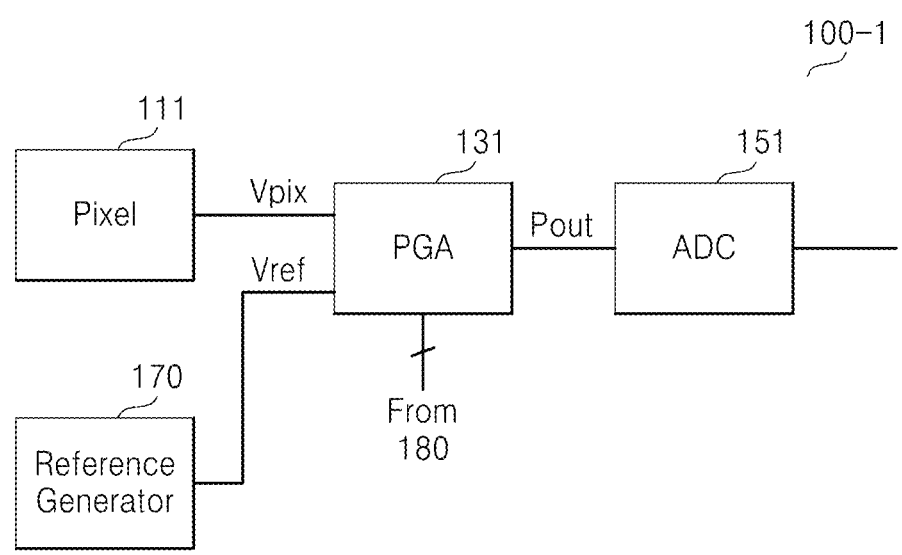
FIG. 3 is an example diagram of a part of the CMOS image sensor illustrated in FIG. 1.

FIG. 3 is an example diagram of a part 100-1 of the CMOS image sensor 100 illustrated in FIG. 1. For clarity of the description, FIG. 3 shows the part 100-1 of the image sensor 100 which processes the pixel signal Vpix output through one column of pixels. The structure illustrated in FIG. 3 corresponds to digital CDS using column-parallel analog-to-digital conversion.

The reference generator 170 outputs a reference voltage Vref to the PGA 131. The PGA 131 performs CDS and amplification in response to a plurality of control signals output from the timing generator 180 and outputs an output signal Pout. The ADC 151 converts the output signal Pout into a digital signal.

Figure 4:
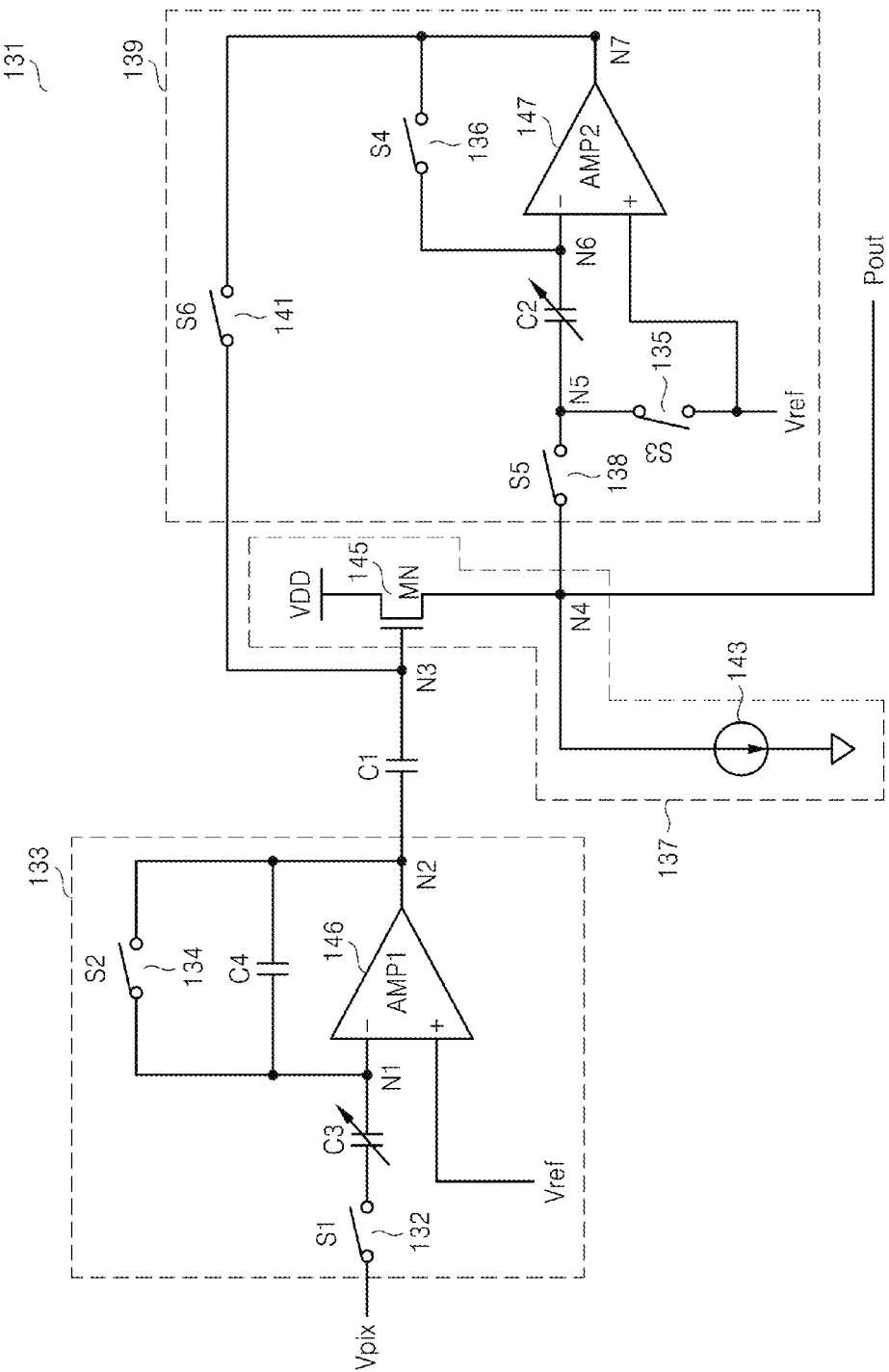
FIG. 4 is an example circuit diagram of a programmable gain amplifier (PGA) illustrated in FIG. 3.

FIG. 4 is an example circuit diagram of the PGA 131 illustrated in FIG. 3. Referring to FIGS. 1 through 4, the PGA 131 includes a sampling circuit 133, a first capacitor C1, a source follower 137, and an error amplifier 139.

Figure 5:
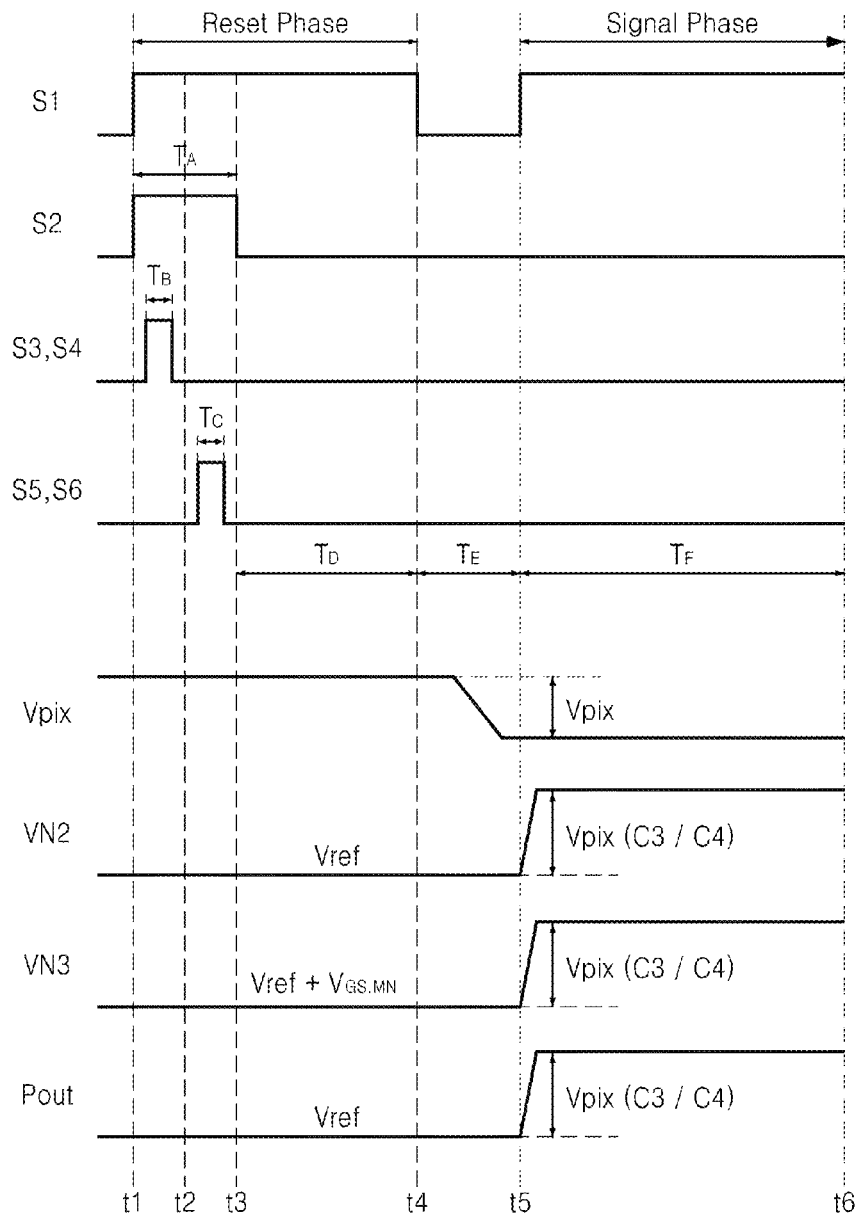
FIG. 5 is a timing chart illustrating an example operation of the PGA illustrated in FIG. 4.

The sampling circuit 133 may perform sampling, e.g., CDS on an input signal, i.e., the pixel signal Vpix using the reference voltage Vref. The sampling circuit 133 may include a first switch 132, a second switch 134, a third capacitor C3, a fourth capacitor C4, and an amplifier 146. Referring to FIG. 5, the switches 132 and 134 are switched in response to switch signals S1 and S2, respectively.

The third capacitor C3 is used to sample the pixel signal Vpix output from the pixel 111. The amplification ratio of the PGA 131 is determined according to the ratio between the capacitance of the third capacitor C3 and the capacitance of the fourth capacitor C4. The third capacitor C3 may be implemented as a variable capacitor.

The first switch 132 may transmit the pixel signal Vpix from the pixel 111 to the third capacitor C3. The third capacitor C3 may be connected between the first switch 132 and a first node N1. The second switch 134 and the fourth capacitor C4 may be connected in parallel between the first node N1 and a second node N2.

The source follower 137 includes a current source 143 and a metal oxide semiconductor (MOS) transistor 145. The current source 143 is used to provide a bias current for the source follower 137. It should be understood that the source follower 137 include any circuit capable transferring voltage between other circuit elements (e.g., a voltage buffer). The MOS transistor 145 may be connected between a power line for supplying a power supply voltage VDD and a fourth node N4. A gate of the MOS transistor 145 is connected to a third node N3. The MOS transistor 145 may be implemented as an N-channel MOS (NMOS) transistor.

The error amplifier 139 (or reset circuit) may include a third switch 135, a fourth switch 136, a fifth switch 138, a sixth switch 141, a second capacitor C2, and an amplifier 147. Referring to FIG. 5, the switches 135, 136, 138, and 141 are switched in response to switch signals S3, S4, S5, and S6, respectively. The switch signals S1 through S6 may be generated by the timing generator 180.

The third switch 135 may be connected between a fifth node N5 and the reference generator 170. The fourth switch 136 may be connected between a sixth node N6 and a seventh node N7. The fifth switch 138 may be connected between the fourth node N4 and the fifth node N5. The sixth switch 141 may be connected between the third node N3 and the seventh node N7.

FIG. 5 is a timing chart illustrating an example operation of the PGA 131 illustrated in FIG. 4. Referring to FIGS. 4 and 5, the error amplifier 139 may reset (or set) the voltage Pout of the output node N4 of the source follower 137 to the reference voltage Vref during a source follower reset operation period $T_C$ while the source follower 137 is reset. During an error amplifier reset operation period $T_B$ while the error amplifier 139 is reset, the error amplifier 139 cancels an offset of the amplifier 147 using the second capacitor C2. An error amplifier reset operation is performed prior to a source follower reset operation. It should be understood that the error amplifier 139 may be circuit capable of cancelling or correcting an offset of the amplifier 147.

Referring to FIGS. 4 and 5, a reset signal sampling period or reset signal processing period (simply referred to as a "reset phase") is defined by a difference between a time point t1 and a time point t4. An image signal sampling period or image signal processing period (simply referred to as "signal phase") is defined by a difference between a time point t5 and a time point t6.

In the reset phase, when the first switch 132 is turned on, the third capacitor C3 of the sampling circuit 133 receives and stores the pixel signal Vpix output from the pixel 111. During a sampling circuit reset operation period $T_A$ defined by a difference between the time point t1 and a time point t3, when the second switch 134 is turned on, the fourth capacitor C4 is reset. During the error amplifier reset operation period $T_B$ defined by a difference between the time point t1 and a time point t2, when the third and fourth switches 135 and 136 are turned on, the offset or offset voltage of the amplifier 147 is stored in the second capacitor C2. During the source follower reset operation period $T_C$ defined by a difference between the time points t2 and t3, when the fifth and sixth switches 138 and 141 are turned on, the output Pout of the fourth node N4, i.e., the PGA 131, is reset or set to the reference voltage Vref and a voltage VN3 of the third node N3, i.e., an input terminal of the source follower 133, is reset or set to an input voltage higher than the reference voltage Vref by a threshold voltage $V_{GS,MN}$ of the MOS transistor 145.

As shown in FIG. 5, the error amplifier reset operation period $T_B$ and the source follower reset operation period $T_C$ do not overlap each other. The sampling circuit reset operation period $T_A$ includes the error amplifier reset operation period $T_B$ and the source follower reset operation period $T_C$.

During an analog-to-digital conversion period $T_D$ defined by a difference between the time points t3 and t4, the ADC 151 may convert the analog output signal Pout of the PGA 131 into a digital signal. During an interruption period $T_E$ defined by a difference between the time points t4 and t5, the first switch 132 is turned off and the pixel signal Vpix is not applied to the sampling circuit 133.

In the signal phase, i.e., during an amplification period $T_F$, the first switch 132 is turned on and the pixel signal Vpix is amplified according to a ratio C3/C4 of the capacitance of the third capacitor C3 to the capacitance of the fourth capacitor C4 in the sampling circuit 133.

Based on FIG. 5, the change of the pixel signal Vpix, the change of the voltages VN2 and VN3 of the respective nodes N2 and N3, and the change of the output voltage Pout of the source follower 137 may be understood. In other words, in the signal phase, the voltages VN2, VN3, and Pout correspond to the product of the pixel signal Vpix and the ratio C3/C4.

Figure 6:
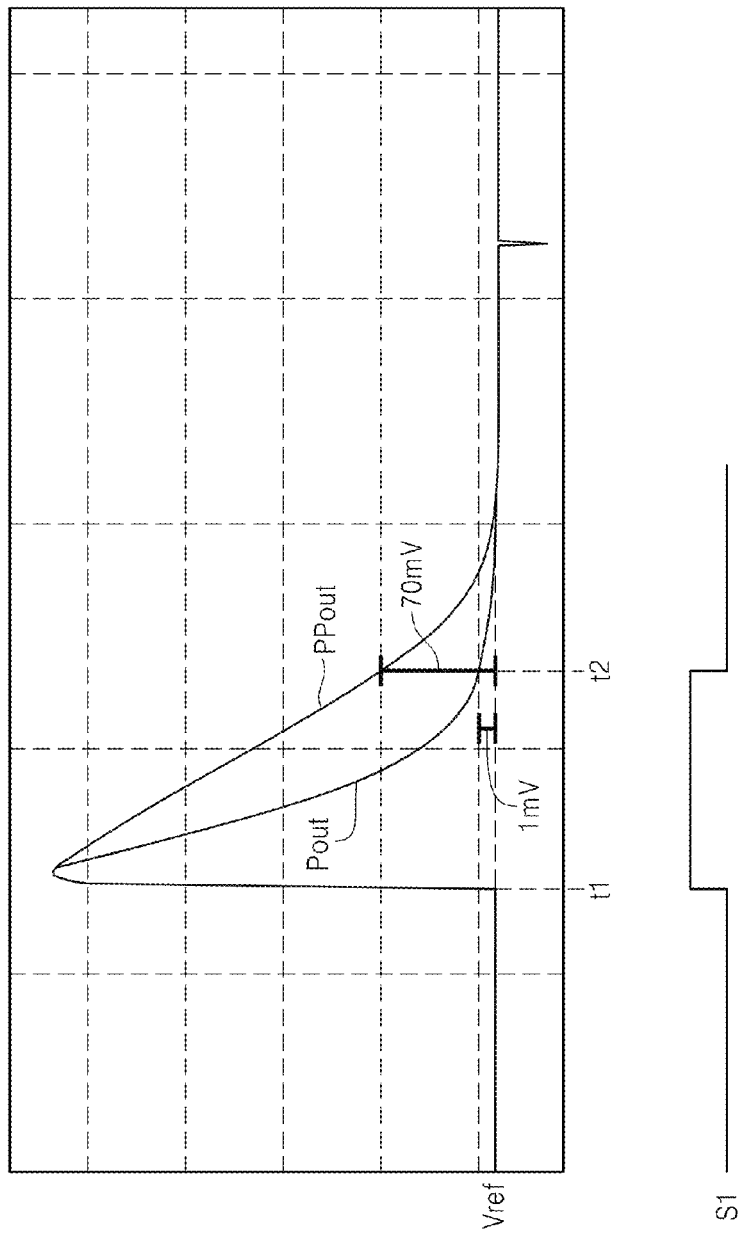
FIG. 6 is an example timing chart of an output voltage of the PGA illustrated in FIG. 4.

FIG. 6 is an example timing chart of an output voltage of the PGA 131 illustrated in FIG. 4. When a conventional PGA does not include the source follower 137 and the error amplifier 139 connected to an input terminal of a delta-sigma ADC or successive approximation register (SAR) ADC, an output signal PPout of the PGA is 70 mV at the time point t2 in FIG. 6. Thus, the output PPout is not settled at time point t2. Contrarily, the PGA 131 according to at least one example embodiment of the inventive concepts is connected to the input terminal of the delta-sigma ADC or the SAR ADC such that the output signal Pout of the PGA 131 is about 1 mV at the time point t2 in FIG. 6. Thus, the output signal Pout is settled at time point t2. As shown in FIG. 6, the level of the output signal Pout is significantly lower than that of the output signal PPout at the time point t2.

Figure 7:
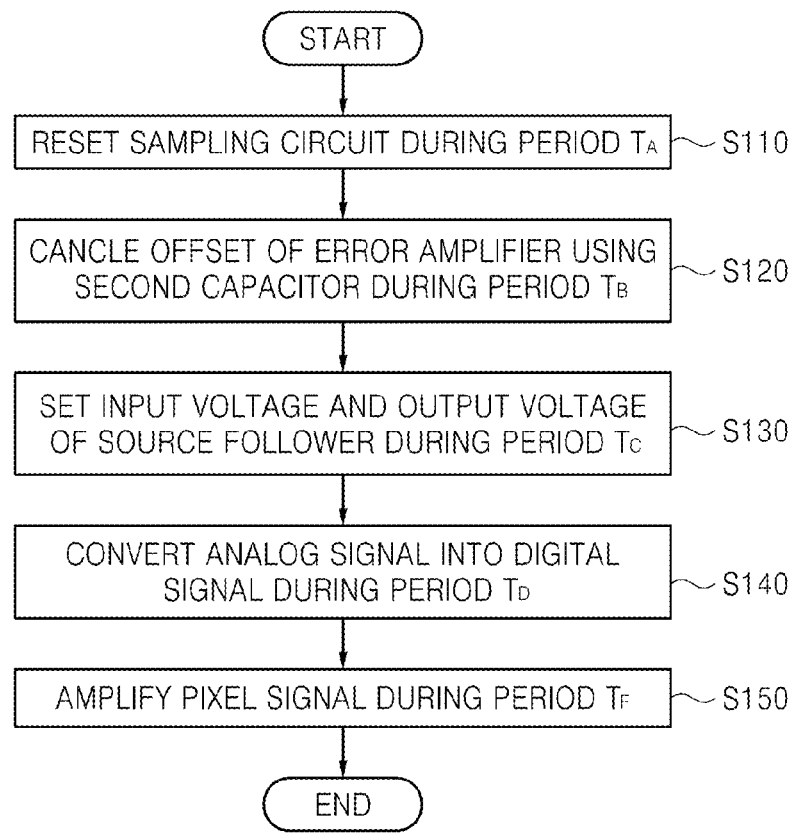
FIG. 7 is a flowchart of a method of operating a CMOS image sensor according to at least one example embodiment of the inventive concepts.

FIG. 7 is a flowchart of a method of operating the CMOS image sensor 100 according to at least one example embodiments of the inventive concepts. Referring to FIGS. 1 through 7, in operation S110, the sampling circuit 133 resets the fourth capacitor C4 according to the operation of the second switch 134 during the sampling circuit reset operation period $T_A$.

In operation S120, the error amplifier 139 cancels the offset using the second capacitor C2 according to the operation of the switches 135 and 136 during the error amplifier reset operation period $T_B$ in the sampling circuit reset operation period $T_A$. The error amplifier 139 sets or resets the input voltage VN3 of the input terminal of the source follower 137 and the voltage Pout of the output terminal of the source follower 137 according to the operation of the switches 138 and 141 during the source follower reset operation period $T_C$ in the sampling circuit reset operation period $T_A$ in operation S130.

In operation S140, during the analog-to-digital conversion period $T_D$, the PGA 131 converts the analog output signal Pout into a digital signal. In operation S150, during the image signal sampling period $T_F$, the PGA 131 amplifies the pixel signal Vpix using the capacitors C3 and C4 included the sampling circuit 133.

Figure 8:
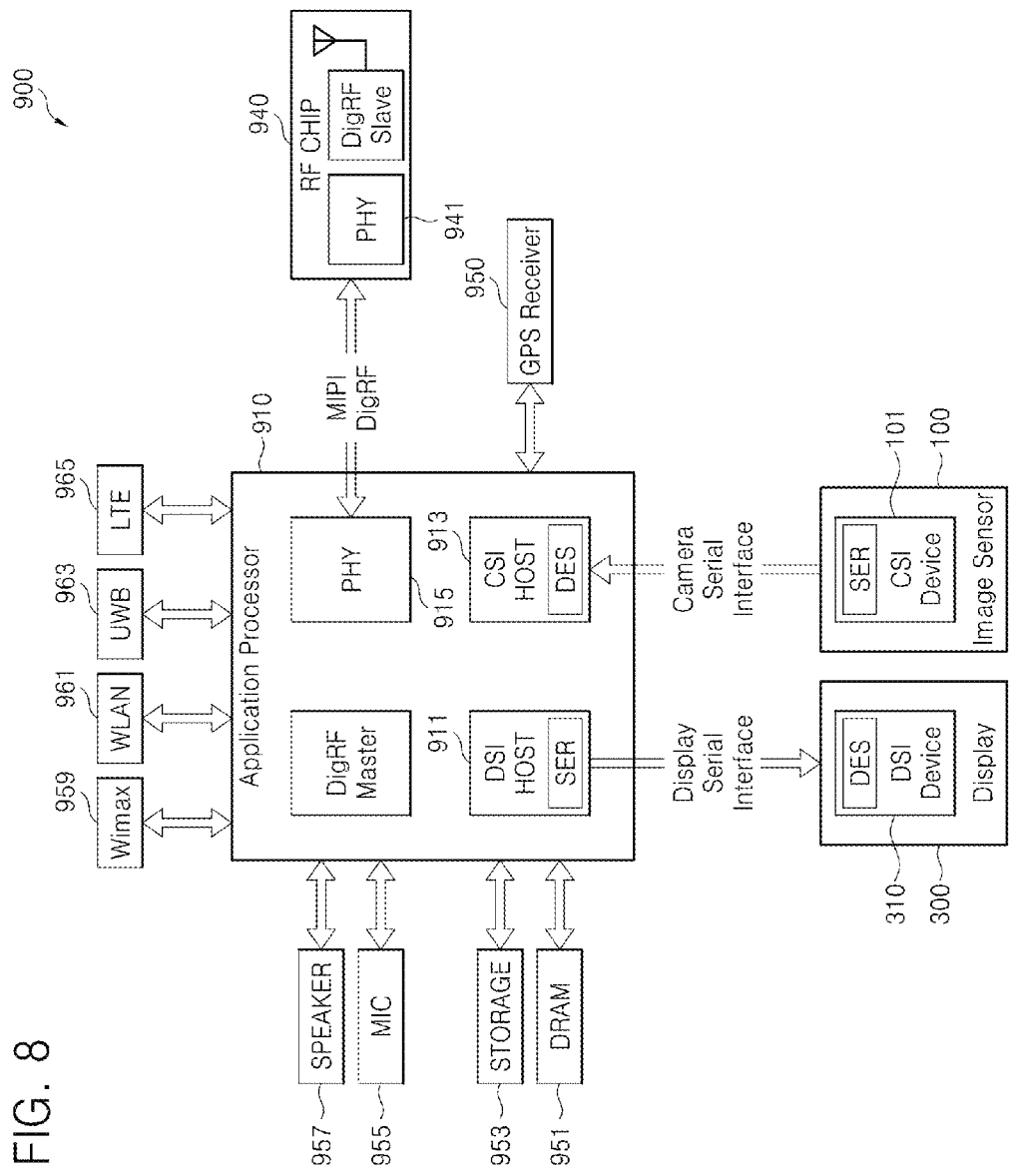
FIG. 8 is a block diagram of an image processing device including the structure of the CMOS image sensor illustrated in FIG. 1 according to at least one example embodiment of the inventive concepts.

FIG. 8 is a block diagram of an image processing device 900 including the structure of the CMOS image sensor 100 illustrated in FIG. 1 according to at least one example embodiment of the inventive concepts.

Referring to FIGS. 1 through 8, the image processing device 900 may be implemented as a portable electronic device which can use or support mobile industry processor interface (MIPI). The portable electronic device may be a laptop computer, a PDA, a portable media player (PMP), a cellular phone, a smart phone, a tablet PC, a digital camera, wearable computer, a mobile internet device (MID), etc.

The image processing device 900 includes an application processor 910, the CMOS image sensor 100, and the display 300.

A camera serial interface (CSI) host 913 implemented in the application processor 910 may perform serial communication with a CSI device 101 included in the CMOS image sensor 100 through a CSI. A deserializer DES and a serializer SER may be implemented in the CSI host 913 and the CSI device 101, respectively. The CMOS image sensor 100 may be the CMOS image sensor that has been described with reference to FIGS. 1 through 7.

A DSI host 911 implemented in the application processor 910 may perform serial communication with a DSI device 310 included in the display 300 through DSI. A serializer SER and a deserializer DES may be implemented in the DSI host 911 and the DSI device 310, respectively. The deserializers DES and the serializers SER may process electrical signals and/or optical signals.

The image processing device 900 may also include a radio frequency (RF) chip 940 for communicating with the application processor 910. A physical layer (PHY) 915 of the application processor 910 and a PHY 941 of the RF chip 940 may communicate data with each other according to MIPI DigRF. The image processing device 900 may further include a global positioning system (GPS) receiver 950, a memory 951 such as dynamic random access memory (DRAM), a data storage device 953 implemented as a non-volatile memory such as a NAND flash memory, a microphone (MIC) 955, and a speaker 957.

The image processing device 900 may communicate with external devices using at least one communication protocol or standard, such as worldwide interoperability for microwave access (Wimax) 959, a wireless local area network (WLAN) 961, an ultra-wideband (UWB) 963, and/or long term evolution (LTE™) 965. The image processing device 900 may also communicate with external devices using Bluetooth or Wi-Fi.

As described above, according to at least one example embodiment of the inventive concepts, a PGA reduces kick-back noise and a settling time, thereby operating at high speed. An image sensor including the PGA generates a stable output voltage that quickly settles during a reset signal sampling period.

While the inventive concepts have been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. A programmable gain amplifier, comprising:
a sampling circuit configured to perform correlated double sampling on an input signal using a reference voltage;
a source follower;
a first capacitor connected between the sampling circuit and the source follower; and
an error amplifier connected between an input terminal of the source follower and an output terminal of the source follower, the error amplifier being configured to reset a voltage of the output terminal of the source follower to the reference voltage during a source follower reset operation that resets the source follower, wherein, the error amplifier includes a plurality of switches, a second capacitor, and an amplifier configured to amplify a difference between the reference voltage and an output voltage of the second capacitor, the switches are arranged to store an offset of the amplifier in the second capacitor during an error amplifier reset operation that resets the error amplifier, and the switches are arranged to reset the voltage of the output terminal of the source follower to the reference voltage and reset the voltage of the input terminal of the source follower to the input voltage during the source follower reset operation.

2. The programmable gain amplifier of claim 1, wherein the source follower is implemented as a metal oxide semiconductor (MOS) transistor, and the error amplifier is configured to reset the voltage of the input terminal of the source follower to an input voltage higher than the reference voltage by a threshold voltage of the MOS transistor during the source follower reset operation.

3. The programmable gain amplifier of claim 1, wherein the error amplifier is configured to cancel an offset of the error amplifier using the second capacitor during the error amplifier reset operation, the error amplifier reset operation occurring prior to the source follower reset operation.

4. An image sensor, comprising:
a pixel; and
a programmable gain amplifier configured to amplify a pixel signal output from the pixel,
the programmable gain amplifier including,
a sampling circuit configured to perform correlated double sampling on an input signal using a reference voltage,
a source follower,
a first capacitor connected between the sampling circuit and the source follower, and
an error amplifier connected between an input terminal of the source follower and an output terminal of the source follower, the error amplifier being configured to reset a voltage of the output terminal of the source follower to the reference voltage during a source follower reset operation that resets the source follower.

5. The image sensor of claim 4, wherein the source follower is implemented as a metal oxide semiconductor (MOS) transistor, and the error amplifier is configured to reset a voltage of the input terminal of the source follower to an input voltage higher than the reference voltage by a threshold voltage of the MOS transistor during the source follower reset operation in a reset signal sampling period.

6. The image sensor of claim 4, wherein the error amplifier is configured to cancel an offset of the error amplifier using a second capacitor during an error amplifier reset operation that resets the error amplifier, the error amplifier reset operation occurring prior to the source follower reset operation, and the error amplifier reset operation and the source follower reset operation occurring during a reset signal sampling period.

7. The image sensor of claim 4, wherein,
the error amplifier includes a plurality of switches, a second capacitor, and an amplifier configured to amplify a difference between the reference voltage and an output voltage of the second capacitor,
the switches are arranged to store an offset of the amplifier in the second capacitor during an error amplifier reset operation that resets the error amplifier;
the switches are arranged to reset the voltage of the output terminal of the source follower to the reference voltage and reset the voltage of the input terminal of the source follower to the input voltage during the source follower reset operation, and
the error amplifier reset operation and the source follower reset operation are performed during a reset signal sampling period.

8. An image processing device, comprising:
the image sensor of claim 4; and
an image signal processor configured to process image data processed by the image sensor.

9. The image processing device of claim 8, wherein the source follower is implemented as a metal oxide semiconductor (MOS) transistor, and the error amplifier is configured to reset a voltage of the input terminal of the source follower to an input voltage higher than the reference voltage by a threshold voltage of the MOS transistor during the source follower reset operation in a reset signal sampling period.

10. The image processing device of claim 8, wherein the error amplifier is configured to cancel an offset of the error amplifier using a second capacitor during an error amplifier reset operation that resets the error amplifier, the error amplifier reset operation occurring prior to the source follower reset operation, and the error amplifier reset operation and the source follower reset operation occurring during a reset signal sampling period.

11. The image processing device of claim 8, wherein,
the error amplifier includes a plurality of switches, a second capacitor, and an amplifier configured to amplify a difference between the reference voltage and an output voltage of the second capacitor,
the switches are arranged to store an offset of the amplifier in the second capacitor during an error amplifier reset operation that resets the error amplifier,
the switches are arranged to reset the voltage of the output terminal of the source follower to the reference voltage and reset the voltage of the input terminal of the source follower to the input voltage during the source follower reset operation, and
the error amplifier reset operation and the source follower reset operation occur during a reset signal sampling period.

12. A portable electronic device, comprising:
the image processing device of claim 8; and
an application processor configured to process image data processed by the image sensor.

13. The portable electronic device of claim 12, wherein the error amplifier is configured to cancel an offset of the error amplifier using a second capacitor during an error amplifier reset operation that resets the error amplifier, the error amplifier reset operation occurring prior to the source follower reset operation, and the error amplifier reset operation and the source follower reset operation occurring during a reset signal sampling period.

14. The portable electronic device of claim 12, wherein,
the error amplifier includes a plurality of switches, a second capacitor, and an amplifier configured to amplify a difference between the reference voltage and an output voltage of the second capacitor,
the switches are arranged to store an offset of the amplifier in the second capacitor during an error amplifier reset operation that resets the error amplifier,
the switches are arranged to reset the voltage of the output terminal of the source follower to the reference voltage and reset the voltage of the input terminal of the source follower to the input voltage during the source follower reset operation, and
the error amplifier reset operation and the source follower reset operation are performed during a reset signal sampling period.

15. An image sensor, comprising:
at least one pixel;
a voltage generator configured to generate a reference voltage;
a programmable gain amplifier connected to the at least one pixel and the voltage generator, the programmable gain amplifier including,
 a sampling circuit configured to perform correlated double sampling on an input signal using the reference voltage, the input signal being based on light incident to the at least one pixel, and
 a voltage transfer circuit configured to output a voltage from the sampling circuit; and
a controller configured to control the programmable gain amplifier to operate in at least a reset phase and a signal phase, the reset phase being a phase in which an output terminal of the voltage transfer circuit is reset to the reference voltage, the signal phase being a phase in which the sampling circuit amplifies the input signal according to a capacitance ratio of capacitors within the sampling circuit and the voltage transfer circuit outputs the amplified signal.

16. The image sensor of claim 15, wherein the programmable gain amplifier includes a reset circuit configured to reset the output terminal of the voltage transfer circuit to the reference voltage during the reset phase.

17. The image sensor of claim 16, wherein the reset circuit includes a switching circuit configured to connect a capacitor between the output terminal of the voltage transfer circuit and an input terminal of an amplifier of the reset circuit.

18. The image sensor of claim 17, wherein the reset circuit is configured to cancel an offset of the amplifier of the reset circuit using the capacitor during the reset phase.

19. The image sensor of claim 15, wherein the controller is configured to operate the programmable gain amplifier in the signal phase subsequent to the reset phase.

* * * * *